(12) United States Patent
Chacko et al.

(10) Patent No.: US 8,806,093 B2
(45) Date of Patent: Aug. 12, 2014

(54) METHOD, APPARATUS, AND SYSTEM FOR ENABLING A DETERMINISTIC INTERFACE

(75) Inventors: Bibbin Chacko, Chandler, AZ (US); Guadalupe J. Garcia, Changler, AZ (US); Saurabh Upadhyay, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/798,292

(22) Filed: Apr. 1, 2010

(65) Prior Publication Data
US 2011/0243211 A1  Oct. 6, 2011

(51) Int. Cl.
*G06F 13/38* (2006.01)
*H04B 17/00* (2006.01)

(52) U.S. Cl.
USPC ............ 710/62; 710/63; 710/64; 710/65; 710/66; 710/67; 710/68; 710/69; 710/70; 710/71; 710/72; 710/73; 710/74; 335/228

(58) Field of Classification Search
None
See application file for complete search history.

(56) References Cited

U.S. PATENT DOCUMENTS

| | | | | |
|---|---|---|---|---|
| 5,630,102 A | * | 5/1997 | Johnson et al. | 703/28 |
| 5,822,779 A | * | 10/1998 | Intrater et al. | 711/168 |
| 5,832,255 A | * | 11/1998 | Roberts et al. | 713/500 |
| 5,857,094 A | * | 1/1999 | Nemirovsky | 703/28 |
| 6,009,488 A | | 12/1999 | Kaviprapu | |
| 6,145,039 A | * | 11/2000 | Ajanovic et al. | 710/105 |
| 7,203,853 B2 | * | 4/2007 | Martwick et al. | 713/320 |
| 7,242,736 B2 | * | 7/2007 | Schanke et al. | 375/372 |
| 7,382,847 B2 | * | 6/2008 | Adkisson et al. | 375/371 |
| 7,599,459 B2 | * | 10/2009 | Okuyama | 375/372 |
| 7,957,294 B2 | * | 6/2011 | Choi et al. | 370/241 |
| 8,161,210 B1 | * | 4/2012 | Norrie | 710/65 |
| 8,352,773 B2 | * | 1/2013 | Chuang et al. | 713/503 |
| 2003/0165277 A1 | * | 9/2003 | Ohashi et al. | 382/305 |
| 2004/0071250 A1 | * | 4/2004 | Bunton et al. | 375/372 |
| 2004/0204912 A1 | | 10/2004 | Nejedlo et al. | |
| 2005/0010701 A1 | * | 1/2005 | Elboim | 710/52 |
| 2005/0083095 A1 | * | 4/2005 | Kurts et al. | 327/276 |
| 2005/0154946 A1 | | 7/2005 | Mitbander et al. | |
| 2006/0117125 A1 | * | 6/2006 | Tseng | 710/301 |
| 2007/0177701 A1 | * | 8/2007 | Thanigasalam | 375/372 |

(Continued)

FOREIGN PATENT DOCUMENTS

WO  2011/123415 A2  10/2011
WO  2011/123415 A3  1/2012

OTHER PUBLICATIONS

"PHY Interface for the PCI Express Atchitecture" Version 1.00 Jun. 19, 2003 by Intel Corporation.*
International Search Report and Written Opinion received for International Patent Application No. PCT/US2011/030270, mailed on Nov. 30, 2011, 9 pages.

(Continued)

*Primary Examiner* — Henry Tsai
*Assistant Examiner* — Jing-Yih Shyu
(74) *Attorney, Agent, or Firm* — Caven & Aghevli LLC (57) ABSTRACT

To address the need for efficient and reliable testing of integrated devices, system on chips, and computers, deterministic behavior for an interface is accomplished by fixing variation in latency associated with receiver and transmitter data stream. The interface may be a serial interface that is PCIe compliant and corrects latency variations in the receiver that consequently results in deterministic transmit data. Consequently, the data received and/or transmitted is predictable with respect to time and facilitates testing and validation of the devices and logic associated with the interface.

21 Claims, 5 Drawing Sheets

(56) References Cited

U.S. PATENT DOCUMENTS

2008/0147916 A1    6/2008  Mao
2009/0041099 A1    2/2009  Das Sharma et al.
2009/0086874 A1*  4/2009  Wang et al. .................. 375/372
2011/0050314 A1*  3/2011  Glen et al. .................... 327/299

OTHER PUBLICATIONS

International Preliminary Report on Patentability received for the PCT Application No. PCT/US2011/030270, mailed on Oct. 11, 2012, 7 pages.

* cited by examiner

METHOD, APPARATUS, AND SYSTEM FOR ENABLING A DETERMINISTIC INTERFACE

Mainstream processor chips, both in high performance and low power segments, are increasingly integrating additional functionality such as graphics, display engines, security engines, PCIe™ ports (i.e., ports in accordance with the Peripheral Component Interconnect Express (PCI Express™ (PCIe™)) Specification Base Specification version 2.0 (published Jan. 17, 2007) (hereafter the PCIe™ specification) and other PCI-e™ based peripheral devices.

Latency in a packet-switched network is measured either one-way (the time from the source sending a packet to the destination receiving it), or round trip (the one-way latency from source to destination plus the one-way latency from the destination back to the source). Round-trip latency is more often quoted, because it can be measured from a single point. Note that round trip latency excludes the amount of time that a destination system spends processing the packet. Many software platforms provide a service called ping that can be used to measure round-trip latency. Ping performs no packet processing; it merely sends a response back when it receives a packet (i.e. performs a no-op), thus it is a relatively accurate way of measuring latency.

Where precision is important, one-way latency for a link can be more strictly defined as the time from the start of packet transmission to the start of packet reception. The time from the start of packet transmission to the end of packet transmission at the near end is measured separately and called serialization delay. This definition of latency depends on the throughput of the link and the size of the packet, and is the time required by the system to signal the full packet to the wire.

However, in a non-trivial network, a typical packet will be forwarded over many links via many gateways, each of which will not begin to forward the packet until it has been completely received. In such a network, the minimal latency is the sum of the minimum latency of each link, plus the transmission delay of each link except the final one, plus the forwarding latency of each gateway. In practice, this minimal latency is further augmented by queuing and processing delays. Queuing delay occurs when a gateway receives multiple packets from different sources heading towards the same destination. Since typically only one packet can be transmitted at a time, some of the packets must queue for transmission, incurring additional delay. Processing delays are incurred while a gateway determines what to do with a newly received packet. The combination of propagation, serialization, queuing, and processing delays often produces a complex and variable network latency profile.

In light of the complexity of manufacturing integrated PCI-e™ based peripheral devices and any integrated devices with an interface, variations in latency exists between the wafer silicon and packages. The latency variations could result in indeterministic behavior. Presently, the existing PCI-e specification does not address this issue.

(1) A system, logic or chip is deterministic if it reacts (internal state and eventual output) always in the same way according to the order (time stamps) of the events occurring at its input channels. But variations in wafer processing and system testers result in a degree of indeterminism in the test interface unit behavior. This indeterministic behavior adds complexity to testing because the test now has to check for all variations to the expected output.

Figure 1:
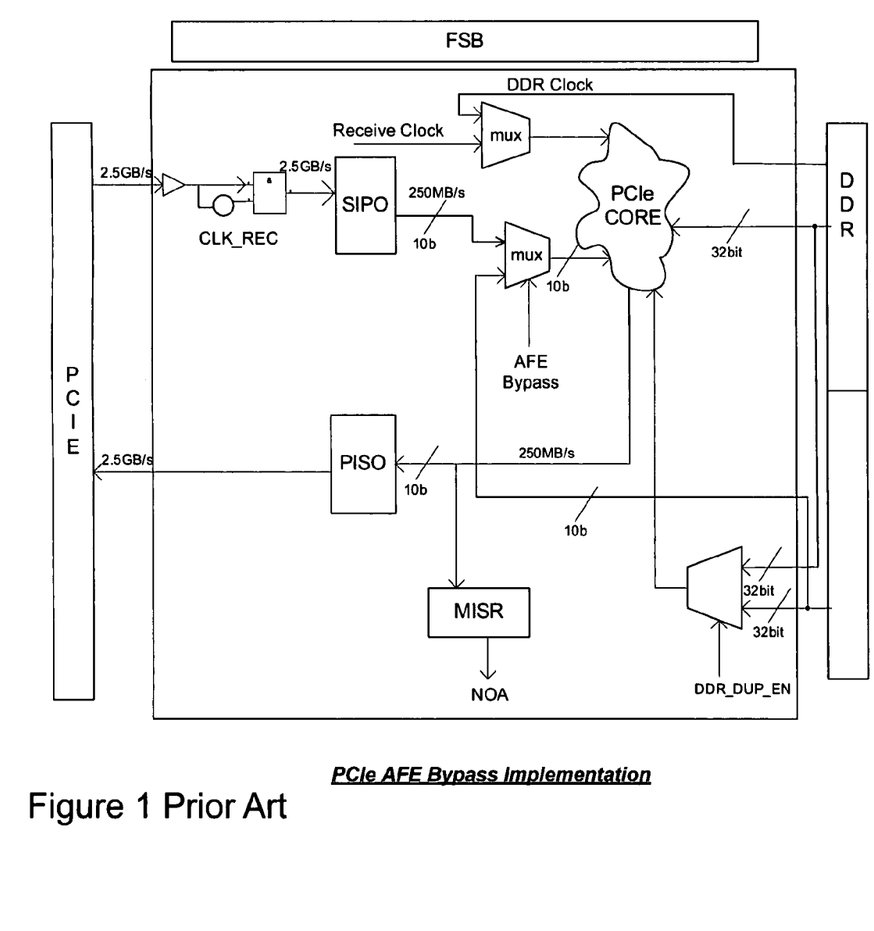
FIG. 1 is prior art.

One existing solution depicted in FIG. 1 is AFE bypass mode manages indeterministic behavior by muxing the parallel data from DDR (Dual Data Rate) interface with the parallel data coming from PCIe AFE (Analog Front End) and the output of the multiplexer goes to PCIe core for processing. Thus, the source of indeterminism, AFE, is bypassed. When AFE Bypass mode is enabled the multiplexer selects data from DDR interface and adjusted (remapped to match DDR pins) PCIe patterns are fed to the DDR interface. Consequently, these patterns map to PCIe core logic on the receiver side. The response to these patterns by the PCIe transmitter is monitored and compared using a MISR that is eventually connected to observation pins. Unfortunately, this solution bypasses the AFE with a resulting loss of the AFE test coverage.

DETAILED DESCRIPTION

In various embodiments, the following descriptions of the figures facilitate deterministic (predictable) behavior of an interface that is used to communicate data. In one embodiment, the interface is a serial interface that is PCIe compliant and corrects latency variations in the receiver that consequently results in deterministic transmit data. Consequently, the data received and/or transmitted is predictable with respect to time and facilitates testing and validation of the devices and logic associated with the interface.

Figure 2:
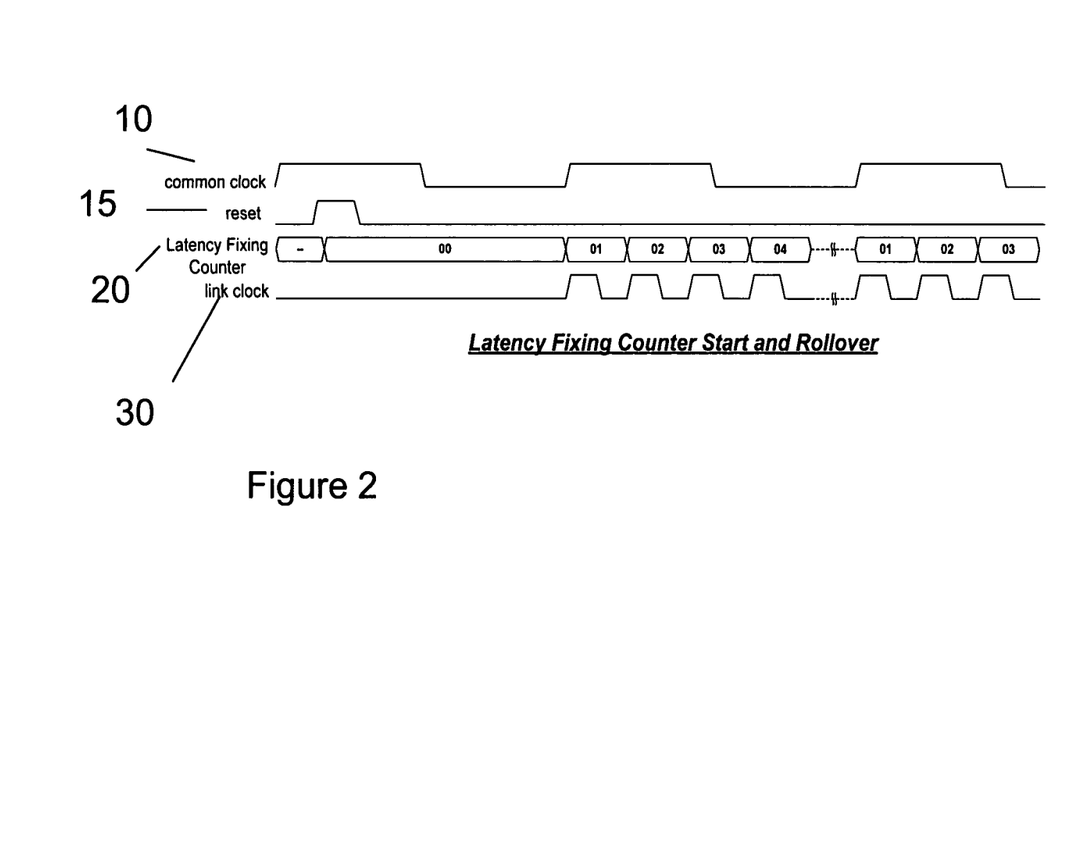
FIG. 2 is a timing diagram of a counter's behavior in accordance with an embodiment of the present invention.

FIG. 2 is a timing diagram of a counter's behavior in accordance with an embodiment of the present invention. In this timing diagram, a common clock 10, a reset 15, a latency fixing counter 20, and a link clock 30 is utilized to enable a latency fixing counter. The first link clock 30 is started a predetermined distance from the common clock 10. Consequently, the counter 20 is started from the first link clock 30. The latency fixing counter 20 is restarted (rollover) on every rising edge of the common clock 10. In one embodiment, the counter is restarted (rollover) to occur for clock ratios with respect to the link clock to common clock.

Figure 3:
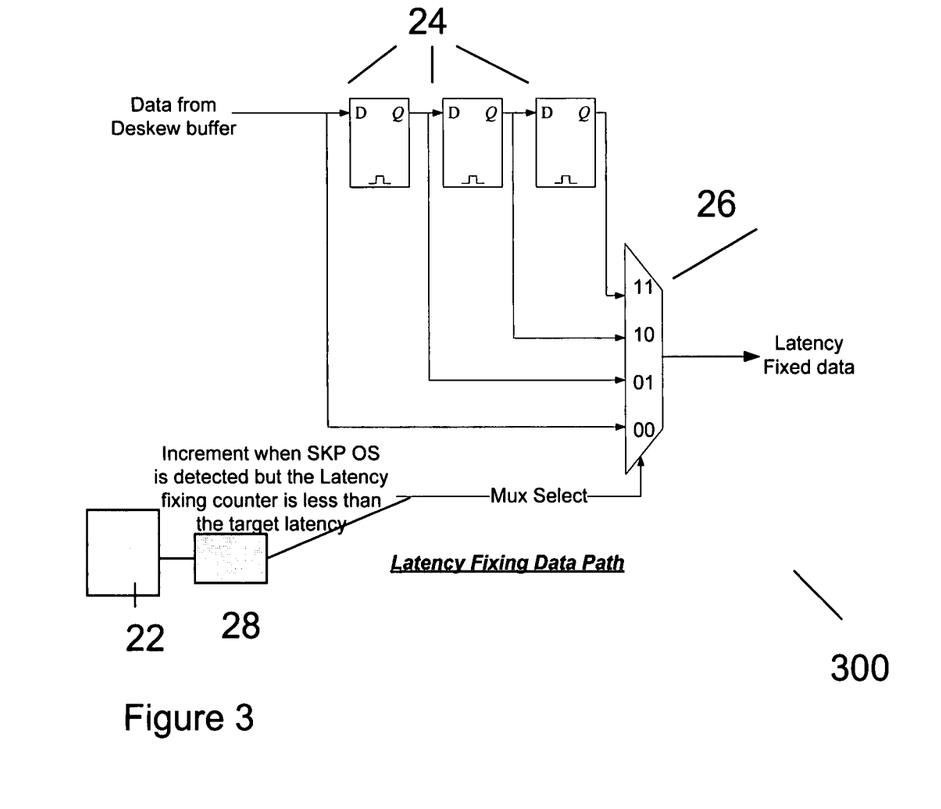
FIG. 3 is an apparatus for adjusting latency of a data path in accordance with one embodiment of the present invention.

FIG. 3 is an apparatus for adjusting latency of a data path in accordance with one embodiment of the present invention. In one apparatus, the apparatus is a latency buffer 300. However, the claimed subject matter is not limited to a buffer and may be a register, volatile or non-volatile memory, may be programmable or fixed. In one embodiment, the size of the buffer is determined based at least in part on indeterminism of the data from a deskew buffer. For example, it may be based on a unit interval (UI) time limit. Also, the size of the buffer may be based at least in part on which generation of the PCIe specification is supported.

In one embodiment, the latency buffer 300 is added after a deskew buffer in a PCIe physical layer. However, the claimed subject matter is not limited to this particular embodiment. One skilled in the art appreciates utilizing a different name or placing the buffer, register, or logic as needed for their particular implementation for a root complex configuration, a system on chip (SoC), memory controller hub (MCH), or a bridge implementation.

However, the claimed subject matter is not limited to data from a deskew buffer and could be received from any receiver or transmitter or intermediate storage. Likewise, the claimed subject matter is not limited to a UI time limit depicted in a PCIe specification. One skilled in the art appreciates modification of different buffer sizes based on the type of application and the specifics of the particular protocol and timing requirements.

In one embodiment, a depth of the buffer is twenty UI for a mode of operation of a PCIe generation two specification and a depth of ten UI for a mode of a PCIe generation one specification.

In this figure, a plurality of flip flop registers 24 receive data from a deskew buffer and stores the data. An output of each flip flop is coupled to an input of a multiplexer 26. A multiplexer input select is coupled to a logic 28 that determines the appropriate time to enable the output of the multiplexer. The logic 28 analyzes a target latency stored in a register 22. In one embodiment, the target latency is an internal register programmed to a value that represents a latency on the PCIe receiver side. In one embodiment, the target latency on the receiver side is a fixed value. In other embodiment, the target latency could be a maximum possible latency on the receiver side. However, the target latency is not limited to a fixed value or a possible maximum latency and can vary based on routing, protocol, semiconductor processing, or a particular design implementation.

A Skip Ordered Set is sent at PCIe receiver side on a common clock. At the same time latency fixing is enabled internally in PCI Express by configuration writes. As soon as the PCI Express latency buffer sees the Skip Ordered Set, it will adjust the latency buffer output pointers to match to the entry that corresponds to the latency fixing counter being equal to the config register programming for the target latency stored in register 22. This mechanism makes sure that the RX side latency is fixed to the programmed value always.

As previously mentioned, a skip ordered set was sent at the PCIe receiver side. A skip ordered set is used by transmitting on all lanes to allow a receiver clock compensation logic to compensate for clock frequency variations between the clock used by a device transmitter to clock out the serial bit stream and the device receiver's recovered clock.

In one embodiment, a Skip Ordered Set for PCIe Generation one and generation two as transmitted is a COM symbol followed by three SKP symbols. If there are repeaters between the two end points, on the receive side of an endpoint the number of SKP symbols may vary from 1 to 5.

|  |
|---|
| COM |
| SKP |
| SKP |
| SKP |

In contrast, in yet another embodiment for PCIe Generation three a Skip Ordered Set as transmitted is shown below. The number of SKP (55h) symbols on the receive side of an end-point in a system with repeaters can be 4, 8, 12, 16 or 20.

|  |
|---|
| 01b |
| 55h |
| 55h |
| 55h |
| 55h |
| 55h |
| 55h |
| 55h |
| 55h |
| 55h |
| 55h |
| 55h |
| 55h |
| E1h (SKP_END) |
| LFSR [22, 22:16] |
| LFSR [15:8] |
| LFSR [7:0] |

In one embodiment, the claimed subject matter facilitates supporting skip ordered sets for PCIe generation one, two, and three. In contrast, in yet another embodiment, the claimed subject matter facilitates supporting skip ordered sets for PCIe generation one and two. In still yet another embodiment, the claimed subject matter facilitates supporting skip ordered set for PCIe generation either one or two.

(2) In response to the latency fixing on the receiver side, the transmitter side also schedules a skip order set. Consequently, this resets the transmitter's LFSR. In the following FIG. 4, the timing diagram for this is depicted.

Figure 4:
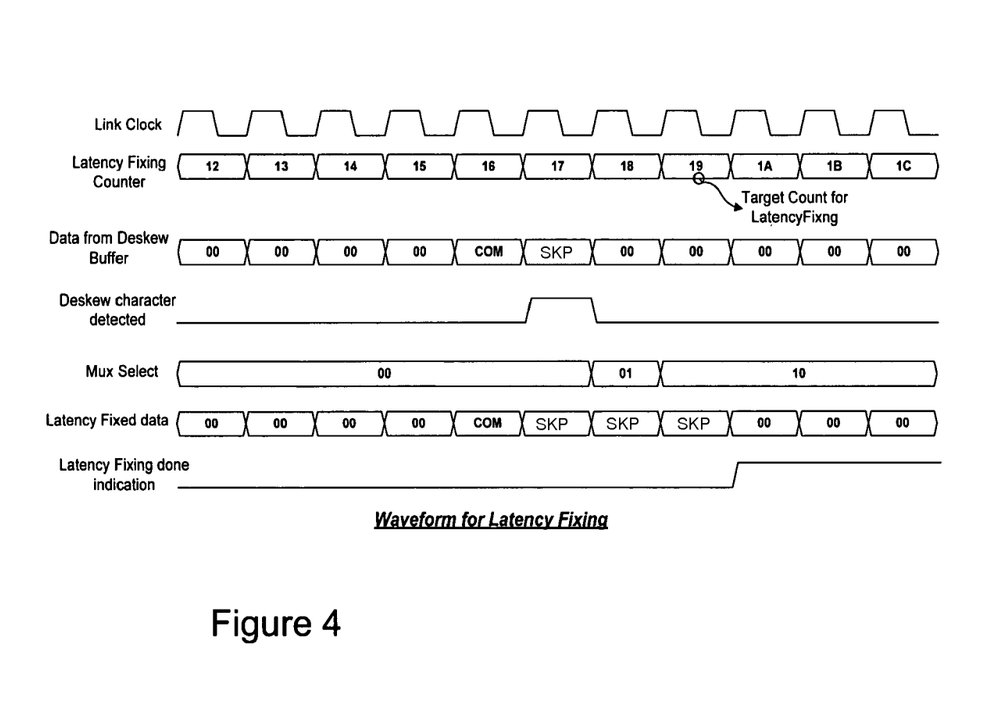
FIG. 4 is a timing diagram of latency adjustment in accordance with one embodiment of the present invention.

FIG. 4 is a timing diagram of latency adjustment in accordance with one embodiment of the present invention. In the previous FIG. 2, a series of latency fixing was performed based on the latency fixing counter and the skip ordered sets. FIG. 4 will illustrate the timing relationship of the latency fixing and the skip ordered sets.

In one embodiment, the delay of the PCIe packets from the PCIe interface pins until it reaches the transaction layer has fixed elements and it has variable elements. In one embodiment, the fixed elements include 8b/10b decoder (depicted as 504 in connection with FIG. 5), elastic buffer, k-align and routing delay. In contrast, for one embodiment, the variable elements include asynchronous interface clock domain to transaction layer clock domains as well as intra-die skew variation and clock jitter. The present invention shows a mechanism for fixing the total delay/latency, adjusting for the variable components. For example, one embodiment utilizes a target latency set to nineteen (hexadecimal) and the actual observed delay is seventeen (hexadecimal). However, one skilled in the art appreciates utilizing a different target latency.

In one embodiment, the target latency is set to nineteen. However, the claimed subject matter is not limited to nineteen. This merely illustrates one example. A deskew character is detected in response to the skip ordered set detected from the data from the deskew buffer (SKIP). Upon the latency fixed data depicted a COM followed by three SKP symbols, an indication of latency fixing data completion occurs: adding two pipe stages of delay in the illustration.

Figure 5:
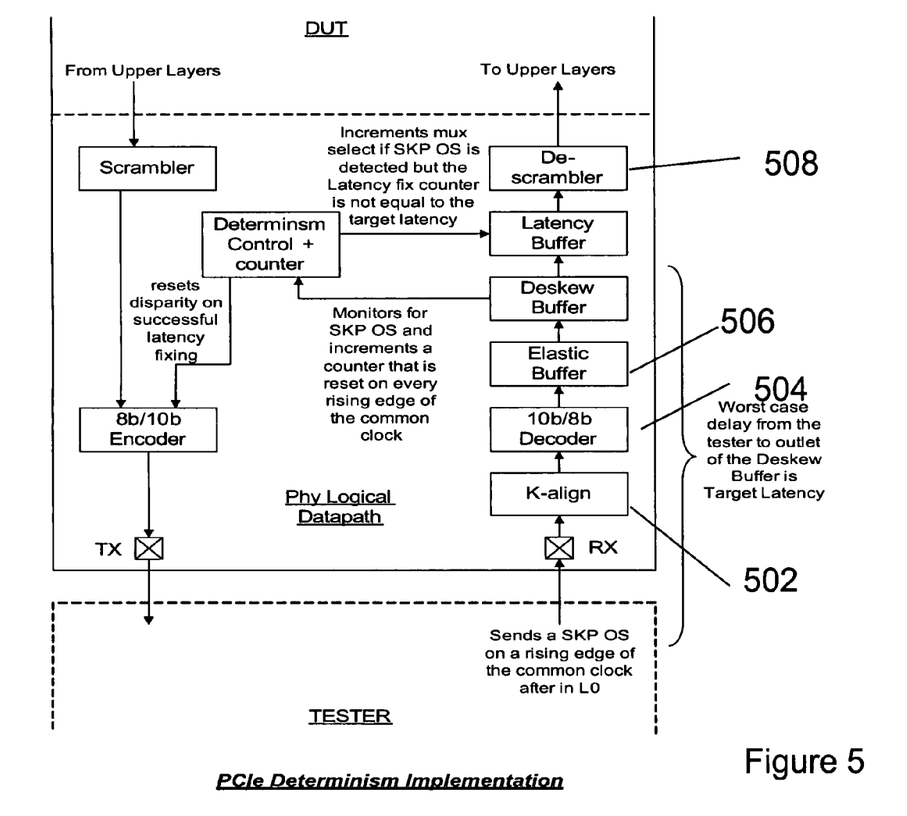
FIG. 5 is a block diagram of an apparatus in accordance with an embodiment of the present invention.

FIG. 5 is a block diagram of an apparatus in accordance with an embodiment of the present invention. This figure illustrates the apparatus to implement the preceding descriptions of FIGS. 2, 3, and 4. In one embodiment, the latency buffer is integrated into a physical data path in the device under test (DUT), which may be a particular integrated device, agent, or any system or root complex that supports PCIe. In one embodiment, the latency buffer may be utilized as described in connection with FIG. 3. In yet another embodiment, the skip ordered set communication and latency fixing that was previously discussed in the preceding FIGS. 2, 3, and 4 may be utilized.

Typically, for PCIe, a symbol boundary needs to be determined out of recovered serial data stream before any further processing can be done. Also, for one embodiment, K-align 502 is an alternate name used for symbol alignment referring to the fact that it done on a K-character, COM. In other embodiments, when the symbol is 8-bits, this is referred to as byte-lock.

In one embodiment, elastic buffer 506 is the buffer used for compensating clock frequency differences (allowed PPM) between the recovered clock and the transmit link clock of a PCIe device and it does so by the means of adding or removing SKP symbols from the data stream.

In one embodiment, descrambler 508 implements an LFSR defined by the PCIe spec and XORs the output of the LFSR with the received data to regenerate original data symbols that were scrambled before being transmitted.

Embodiments may be implemented in code and may be stored on a storage medium having stored thereon instructions which can be used to program a system to perform the instructions. The storage medium may include, but is not limited to, any type of disk including floppy disks, optical disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method for facilitating deterministic data at an interface comprising:
    starting a link clock after a predetermined time after a common clock;
    initiating a counter based on the link clock;
    restarting the counter on every rising edge of the common clock for clock ratios with respect to the link clock to common clock; and
    adjusting an output point of a latency buffer in response to detecting a skip ordered set to match an entry that corresponds to the counter being equal to a value in a register and wherein the latency buffer is to be integrated into a physical data path of the interface,
    wherein the register is to be programmed to vary based on at least one of: routing, protocol, semiconductor processing, and a particular design implementation,
    wherein adjusting the latency buffer output point is performed based on an output of a multiplexer,
    wherein an output selector of the multiplexer is incremented in response to the detection of the skip ordered set and a determination that a value stored in the counter is not equal to a value stored in the register.

2. The method of claim 1 wherein the register is a configuration register that is programmed to a target latency.

3. The method of claim 1 wherein the skip ordered set is a COM symbol followed by three SKP symbols.

4. The method of claim 1 wherein the skip ordered set is a SKP (55h) symbols.

5. The method of claim 4 wherein the skip ordered set with the SKP (55h) symbols has repeaters.

6. The method of claim 1 wherein the interface is a PCIe compliant interface.

7. The method of claim 1 wherein the latency buffer has a depth based on an unit interval (UI).

8. The method of claim 7 wherein the depth of the latency buffer is twenty UI.

9. The method of claim 7 wherein the depth of the latency buffer is ten UI.

10. The method of claim 1, wherein the latency buffer is coupled between a deskew buffer and descrambler.

11. An interface to facilitate deterministic data comprising:
    a receiver to receive a serial data stream;
    a symbol boundary circuit to receive the serial data stream and to determine a symbol boundary from the serial data stream based at least in part on a skip ordered set;
    a decoder to receive the serial data stream from an output of the symbol boundary circuit;
    a first buffer to receive an output of the decoder and to compensating clock frequency differences between a recovered clock from the serial data stream and a transmit link clock;
    a second buffer to receive the output of the first buffer and to compensate for lane-to-lane skew;
    a third buffer to adjust a pointer in response to detecting a skip ordered set to match; and
    an entry that corresponds to a counter being equal to a value in a register that results in the received serial data stream being deterministic, wherein the third buffer is to be integrated into a physical data path of the interface,
    wherein the register is to be programmed to vary based on at least one of: routing, protocol, semiconductor processing, and a particular design implementation,
    wherein adjusting the latency buffer output point is to be performed based on an output of a multiplexer,
    wherein an output selector of the multiplexer is to be incremented in response to the detection of the skip ordered set and a determination that a value stored in the counter is not equal to a value stored in the register.

12. The interface of claim 11 wherein the transmit clock is from a PCIe device.

13. The interface of claim 11 wherein the buffer compensates the clock frequency differences by adding or removing SKP symbols from the serial data stream.

14. The interface of claim 11 wherein the first buffer to receive an output of the decoder and to compensating clock frequency differences between a recovered clock from the serial data stream and a transmit link clock is an elastic buffer.

15. The interface of claim 11 wherein the second buffer is a deskew buffer.

16. The interface of claim 11 wherein the third buffer is a latency buffer.

17. The interface of claim 11 wherein the decoder is a 10b/8b decoder.

18. The interface of claim 11 wherein a transmitter circuit, responds to the received deterministic serial data stream, resets transmit disparity, and schedules a skip order set that resets a transmitter's LFSR (Linear Feedback Shift Register).

19. A physical layer of a serial data interface comprising:
    a receiver to receive a serial data stream;
    a symbol boundary circuit to receive the serial data stream and to determine a symbol boundary from the serial data stream based at least in part on a skip ordered set;
    a decoder to receive the serial data stream from an output of the symbol boundary circuit;
    a first buffer to receive an output of the decoder and to compensating clock frequency differences between a recovered clock from the serial data stream and a transmit link clock;
    a second buffer to receive the output of the first buffer;

a logic control to receive an output of the second buffer and to control a third buffer, wherein the third buffer is to adjust a pointer in response to detecting a skip ordered set to match; and an entry that corresponds to a counter being equal to a value in a register that results in the received serial data stream being deterministic, wherein the third buffer is to be integrated into a physical data path of the interface, wherein the register is to be programmed to vary based on at least one of: routing, protocol, semiconductor processing, and a particular design implementation, wherein adjusting the latency buffer output point is to be performed based on an output of a multiplexer, wherein an output selector of the multiplexer is to be incremented in response to the detection of the skip ordered set and a determination that a value stored in the counter is not equal to a value stored in the register.

20. The physical layer of claim 19 wherein a transmitter circuit, responds the received deterministic serial data stream, and schedules a skip order set that resets a LFSR (Linear Feedback Shift Register) and performs the same deterministic latency fixing on a data stream from the transmitter circuit.

21. The physical layer of claim 19 wherein the logic control is a deterministic control and counter circuit.

* * * * *